(12) United States Patent
Baxter

(10) Patent No.: US 7,830,172 B1
(45) Date of Patent: Nov. 9, 2010

(54) ACCESSING USER REGISTERS IN AN INTEGRATED CIRCUIT

(75) Inventor: Glenn A. Baxter, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 217 days.

(21) Appl. No.: 11/901,101

(22) Filed: Sep. 13, 2007

(51) Int. Cl.
*H03K 19/173* (2006.01)

(52) U.S. Cl. ............................. 326/41; 326/38; 326/39; 710/100; 710/107; 710/317

(58) Field of Classification Search ............. 326/37–47; 710/100, 305–306, 107, 316, 317, 106; 712/220, 712/225, 34

See application file for complete search history.

(56) References Cited

U.S. PATENT DOCUMENTS

| | | | |
|---|---|---|---|
| 6,429,682 B1 * | 8/2002 | Schultz et al. ................ | 326/41 |
| 7,076,595 B1 * | 7/2006 | Dao et al. .................... | 710/317 |
| 7,143,218 B1 * | 11/2006 | Yin et al. ..................... | 710/107 |
| 7,599,299 B2 * | 10/2009 | Goetting et al. ............. | 370/241 |

* cited by examiner

*Primary Examiner*—Rexford N Barnie
*Assistant Examiner*—Christopher Lo
(74) *Attorney, Agent, or Firm*—LeRoy D. Maunu

(57) ABSTRACT

Access is provided to user registers of a user design implemented on an integrated circuit (IC). A memory of the IC is initialized with instructions, and a portion of the programmable logic and interconnect resources of the IC is configured to implement an access interface, multiplexer logic, and the user design. A processor is coupled to the programmable logic and interconnect resources and executes the instructions from the memory. The processor receives from an external user interface, via the access interface, an access command. For a read command, the processor reads a value from an identified user register and transmits the value to the external user interface. For a write command, the processor writes a write value specified by the access command to the specified user register via the multiplexer logic. The processor and the user design are both coupled to write to the user registers via the multiplexer logic.

17 Claims, 6 Drawing Sheets

US 7,830,172 B1

ACCESSING USER REGISTERS IN AN INTEGRATED CIRCUIT

FIELD OF THE INVENTION

The present invention generally relates to programmable logic devices.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic may be programmed to implement a user design by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

The functionality of a user design implemented by a PLD is controlled by data bits provided to the device for that purpose. The data bits can be stored in volatile memory (e.g., static memory cells), in non-volatile memory (e.g., FLASH memory), or in any other type of memory cell. Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

The development of a user design to be implemented in a PLD may include simulation of the operation of the user design to verify the proper operation of the user design. Verification of the user design may continue with a prototype implementation of the user design in a PLD. Verification of the user design may require access to the state of the user design that is stored in the user registers. Simulation may provide ready access to the state of the user design stored in the user registers, while access to the user registers may be difficult and time consuming for the prototype implementation of the user design in the PLD. However, verification during simulation may be limited by the speed of simulation, which may be much slower than the speed of operation of the prototype implementation of the user design. Thus, access to registers of a user design implemented in a PLD may be required during verification, especially verification that the user design behaves properly during extended operation.

Often, a designer requiring access to registers of the design develops custom logic for accessing the registers, and developing the custom logic may be time consuming and expensive. The custom logic may consume programmable logic and interconnect resources, such that the resources required to implement this custom logic and the user design may exceed the available resources of the PLD.

The present invention may address one or more of the above issues.

SUMMARY

The various embodiments of the invention provide approaches for accessing user registers of a user design implemented on a programmable logic device (PLD). In one approach, access is provided to a plurality of user registers of a user design from an external user interface. The PLD comprises an array of programmable logic and interconnect resources. At least one memory of the PLD is initialized with instructions, and a portion of the programmable logic and interconnect resources is configured to implement an access interface, multiplexer logic, and the user design including the user registers. The PLD further comprises a processor coupled to the programmable logic and interconnect resources. The processor is adapted to execute the instructions from the memory, causing the processor to perform operations including receiving an access command that includes an identifier of one of the user registers from the external user interface via the access interface. In response to the access command being a read command, the processor reads a read value from the one of the user registers and transmits the read value to the external user interface via the access interface. In response to the access command being a write command, the processor writes a write value that is included in the access command to the one of the user registers via the multiplexer logic. The processor and the user design are both coupled to write to the user registers via the multiplexer logic.

In another embodiment, a system provides access to a plurality of user registers of a user design implemented on a PLD. The system comprises a computing arrangement configured with a compiler, a PLD programmer, and a terminal emulator. The compiler generates configuration data from a hardware specification that includes the user design and a module that specifies a processor, instructions for the processor, an access interface, and multiplexer logic. The PLD programmer transfers the configuration data from the computing arrangement to the PLD, and the PLD includes the processor and an array of programmable logic and interconnect resources. The transfer of the configuration data initializes at least one memory of the array with the instructions and implements the access interface, the multiplexer logic, and the user design including the user registers in a portion of the array. The terminal emulator communicates between the computing arrangement and the processor of the PLD. The communicating includes transferring an access command that includes an identifier of one of the user registers from the terminal emulator to the processor via the access interface. The access command is transferred via a receiver of the access interface. The communicating further includes, in response to the access command being a read command, reading a read value from the one of the user registers by the processor and transferring the read value from the processor to the terminal emulator via the access interface. The read value is transferred via a transmitter of the access interface. The communicating also includes, in response to the access command being a write command, writing a write value that is included in the access command to the one of the user registers by the processor via the multiplexer logic. The processor and the user design are both coupled to write to the user registers via the multiplexer logic.

A method for providing access from a user interface to a plurality of user registers of a user design in a PLD is provided in another embodiment. The PLD includes a processor and an array of programmable logic and interconnect resources. The method comprises programming the PLD with configuration data that initializes at least one memory of the array with instructions and implements an access interface, multiplexer logic, and the user design including the user registers in a portion of the array. An access command that includes an identifier of one of the user registers is transferred from the user interface to the processor via the access interface. The access command is transferred via a receiver of the access interface and the transfer is controlled by execution of at least one of the instructions by the processor. For a read command, a read value is read from the one of the user registers by the processor and the read value is transferred from the processor to the user interface via the access interface. The read value is transferred via a transmitter of the access interface and controlled by execution of at least one of the instructions by the processor. For a write command, the method writes a write value that is included in the access command to the one of the user registers by the processor via the multiplexer logic. The processor and the user design are both coupled to write to the user registers via the multiplexer logic.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION OF THE DRAWINGS

Figure 1:
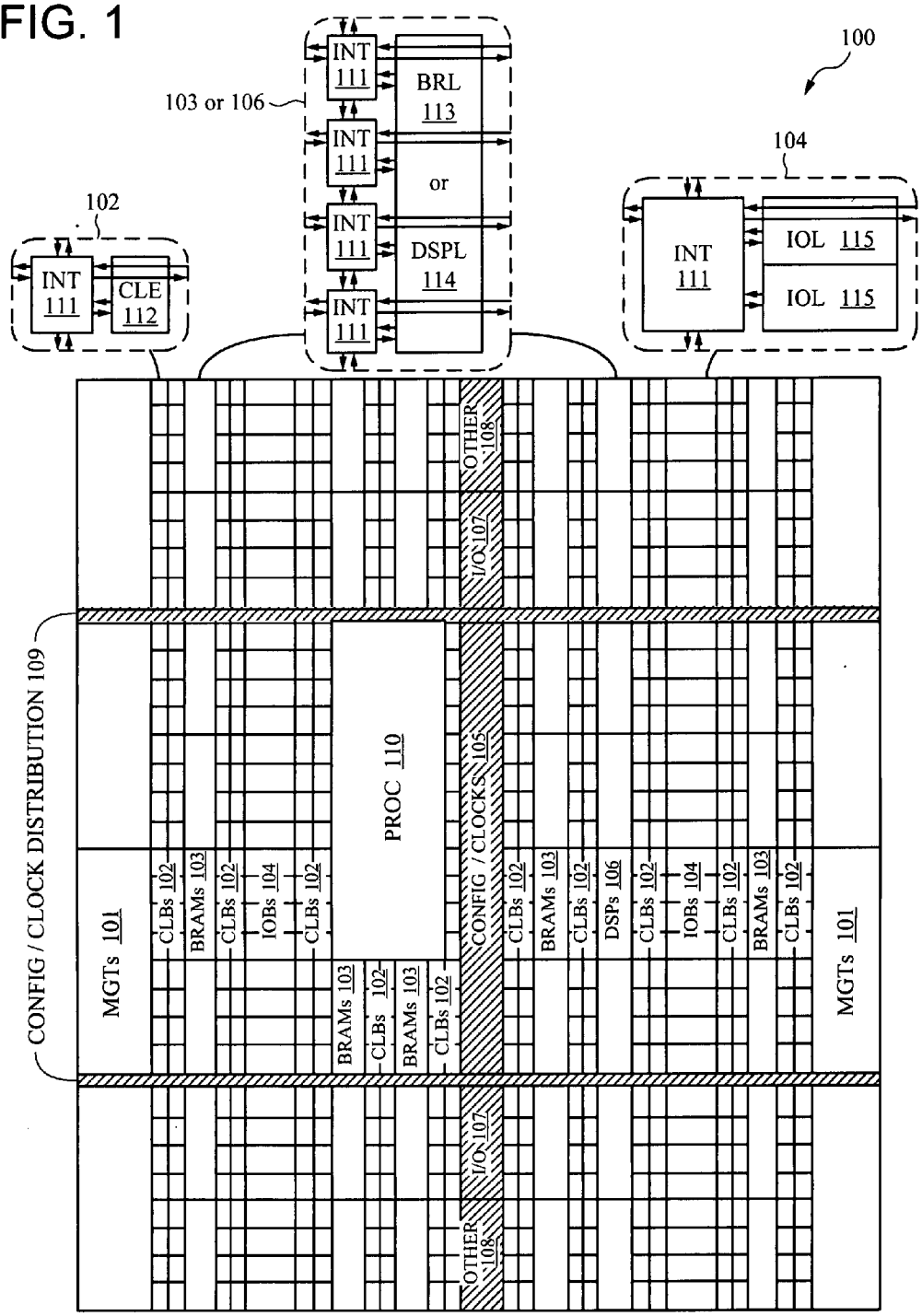
FIG. 1 is a block diagram of a programmable logic device that is configurable in accordance with various embodiments of the invention.

FIG. 1 is a block diagram of a programmable logic device (PLD) that is configurable in accordance with various embodiments of the invention. Certain PLDs, such as advanced FPGAs, can include several different types of programmable logic blocks in an array of programmable logic and interconnect resources. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Figure 2:
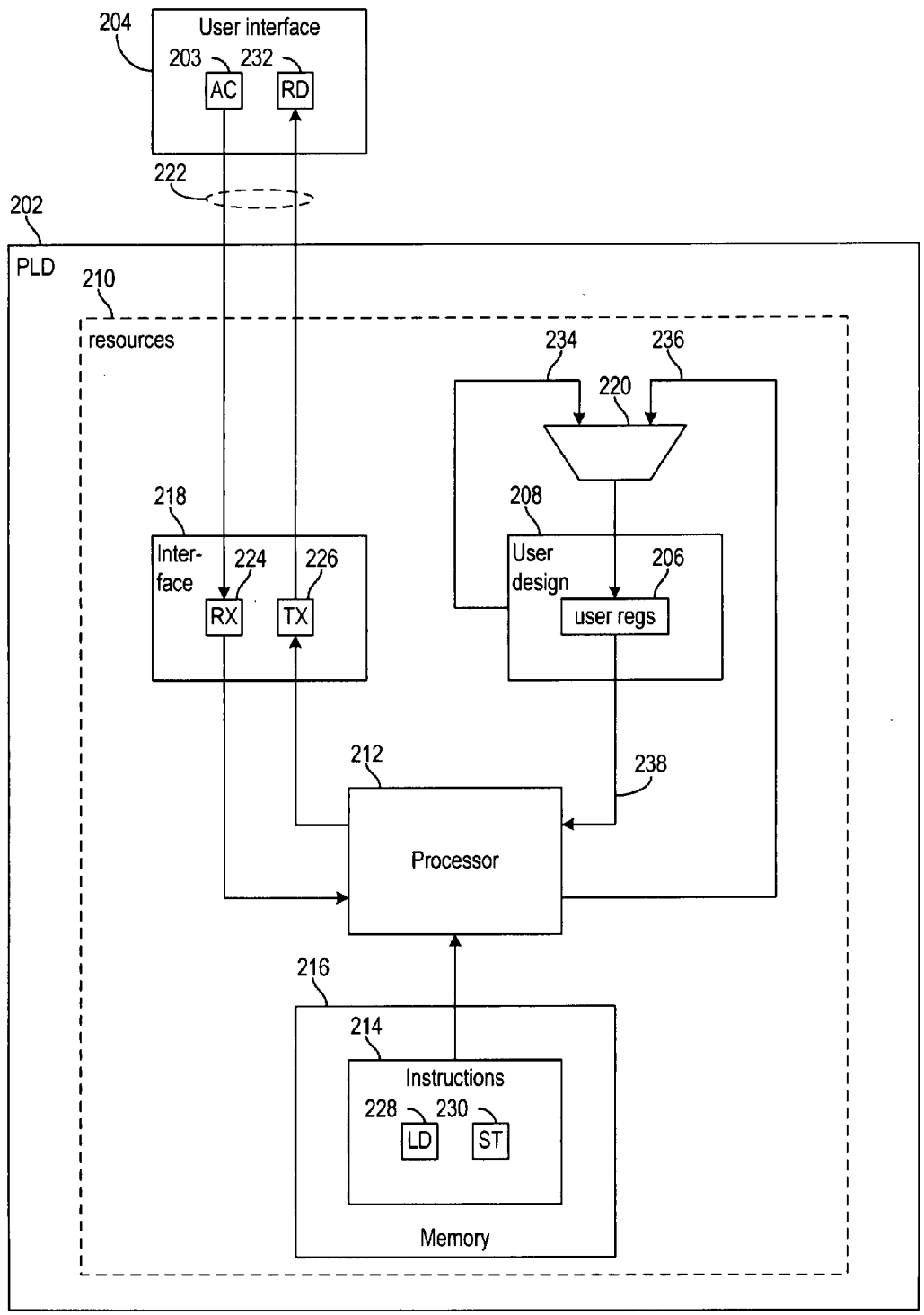
FIG. 2 is a block diagram illustrating a programmable logic device that is configured in accordance with various embodiments of the invention.

FIG. 2 is a block diagram illustrating a programmable logic device (PLD) 202 that is configured in accordance with various embodiments of the invention. A user may provide an access command (AC) 203 at user interface 204 to access one or more user registers 206 in a user design 208 that is implemented in the programmable logic and interconnect resources 210 of PLD 202. The resources may include both the array of programmable logic and interconnect resources, hard processor, and memory resources shown in FIG. 1. The user may read or write the contents of user registers 206 with the appropriate access command 203. The testing of the user design 208 may be assisted by the provided access to user registers 206.

A processor 212 may be programmed to control the access to user registers 206 from user interface 204. In certain embodiments of the invention, the processor 212 may be dedicated hard or soft logic of PLD 202 that may be selectively included in various user designs. User design 208 may alternatively be a user design that does not use processor 212, or user design 208 might be a user design that partially uses the available processing power of processor 212. A processor that is unused by user design 208 or has unused processing power may provide access to user registers 206 while reducing the amount of resources 210 that are needed to provide access to user registers 206. The amount of programmable logic and interconnect resources 210 needed to provide access to user registers 206 may be limited to resources needed to implement access interface 218 and multiplexer 220. Using processor 212 and memory 216 frees up programmable logic and interconnect resources for user design 208 and provides the ability to access user register 206.

It will be appreciated that the processor 212 may be implemented in the resources 210 of PLD 202 in certain other embodiments of the invention. For example, processor 212 may be a MicroBlaze soft processor available from Xilinx, Inc. that is partially utilized by a user design.

The processor 212 may execute instructions 214 for controlling the access to user registers 206 from user interface 204. In one embodiment of the invention, memory 216 for storing instructions 214 may be dedicated cache circuitry for storing instructions 214 executed by processor 212. Thus, access to user registers 206 may be provided without using any of resources 210 for storing instructions 214. In another embodiment of the invention, memory 216 may be implemented in resources 210. For example, resources 210 may include a number of block RAMs that are not used by user design 208 and one or more of these block RAMs may be used for implementing memory 216.

The access interface 218 may connect the processor 212 to the user interface 204. In one embodiment, the user interface 204 may be coupled to the access interface 218 by a parallel port on lines 222, and receiver (RX) 224 and transmitter (TX) 226 may each include multiple bits. In another embodiment, the user interface 204 may be coupled to the access interface 218 by a serial port on lines 222, and receiver 224 and transmitter 226 may each be a single-bit register or a buffer, such an IOB 104 of FIG. 1. It will be appreciated that receiver 224 and transmitter 226 may each include multi-bit registers even though the user interface 204 may be coupled to the access interface 218 by a serial port on lines 222. For example, access interface 218 may include a deserializer for converting an access command 203 that is serially received into parallel data delivered to processor 212, and access interface 218 may also include a serializer for converting parallel data from processor 212 into serial data delivered to user interface 204 for display as read data (RD) 232.

Processor 212 may execute instructions 214 for accessing user registers 206 from user interface 204. Instructions 214 may include at least one load instruction (LD) 228 for loading an access command 203 from user interface 204 via access interface 218. For example, using a serial port on lines 222, each execution of load instruction 228 by processor 212 may transfer one bit of the access command 203 from receiver 224 to processor 212. Each execution of the at least one store instruction (ST) 230 by processor 212 may transfer one bit of a value read from one of user registers 206 from processor 212 to transmitter 226 for display on user interface 204 as read value 232. It will be appreciated that multiple bits may be transferred between processor 212 and access interface 218 during the execution of load instruction 228 or store instruction 230.

Multiplexer 220 may provide write access to some of user registers 206. An access command 203 may be a write command including specified data to be written into one or more of user registers 206. During normal operation of user design 208, multiplexer 220 selects the path on line 234 such that the user design 208 controls any update of user registers 206. During the update of one of user registers 206 for an access command 203 that is a write command, multiplexer 220 selects the path on line 236 such that processor 212 can write the value specified in the write command to one or more of user registers 206.

During normal operation of user design 208, the contents of user registers 206 may be read by processor 212 via the path on line 238 without affecting the operation of user design 208.

Figure 3:
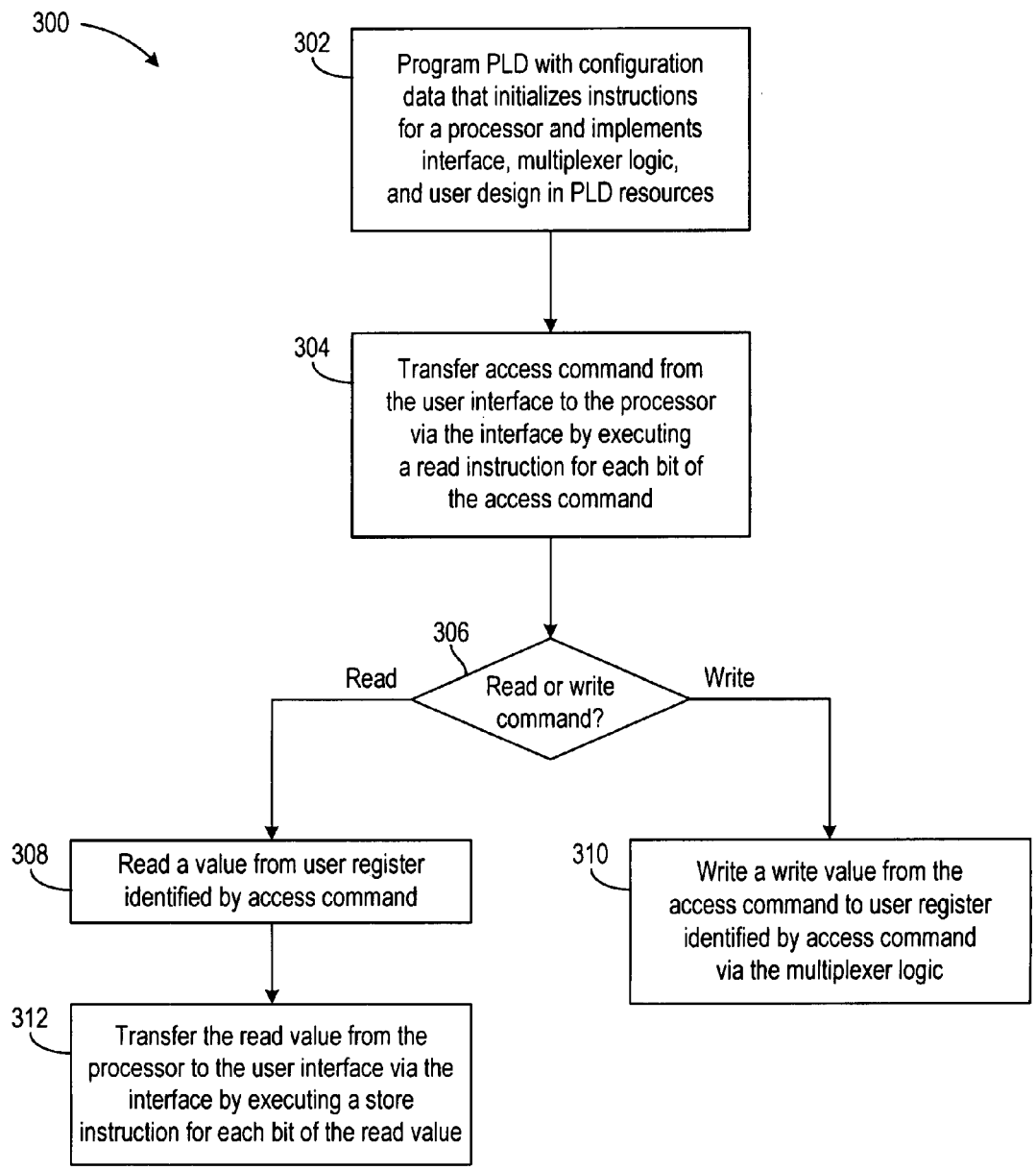
FIG. 3 is a flow diagram of a process for accessing a user register of a user design that is implemented in a programmable logic device in accordance with various embodiments of the invention.

FIG. 3 is an example flow diagram of a process 300 for accessing a user register of a user design that is implemented in a programmable logic device (PLD) in accordance with various embodiments of the invention. The access to the user register may be either a read access or a write access.

At step 302, the PLD may be programmed with configuration data that includes instructions for a processor and that configures the programmable logic and interconnect resources of the PLD to implement a user design, multiplexer logic, and an access interface. The instructions for the processor (hard or soft) includes instructions for accessing the one or more user register in the user design for analysis purposes, along with any instructions that may implement a part of the user design.

At step 304, an access command is transferred from the user interface to the processor via the access interface 218. The processor may execute a load instruction to transfer each bit of the access command from the user interface. The access command may be either a read command or a write command. A read command may include an identifier of the user register to be read and a write command may include an identifier of the user register to be written along with the value that is to be written to the identified user register. More complex commands may be permitted that read or write a set of registers specified by the complex command.

Decision 306 checks whether the access command is a read or a write command. For a read command, process 300 proceeds to step 308, and for a write command, process 300 proceeds to step 310.

At step 308, the processor reads the value stored in the identified user register. At step 312, the processor transfers the read value to the user interface via the access interface 218. The processor may execute a store instruction to transfer each bit of the read value to the user interface.

At step 310, the processor writes a value from the write command to the user register that is identified in the write command. The writing of the user register with the write value may temporarily interrupt the normal operation of the user design. During normal operation, the user design may control the updating of the user registers. To modify the contents of a user register for a write command, a multiplexer interrupts the normal path for updating the user registers to supply the write data to a data input of the user register.

Figure 4:
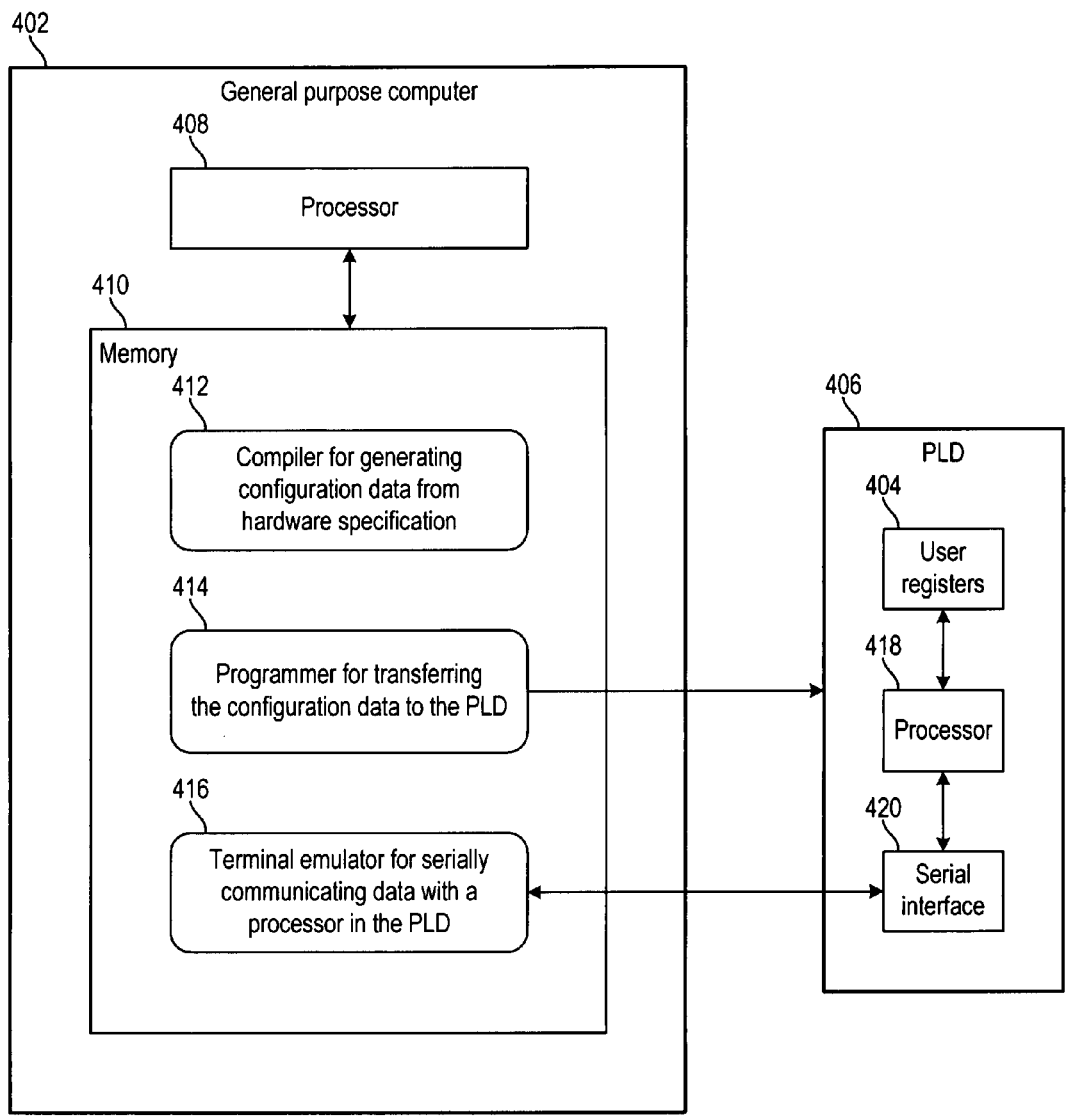
FIG. 4 is a block diagram illustrating a system for providing access to user registers of a user design in a programmable logic device in accordance with various embodiments of the invention.

FIG. 4 is a block diagram of a system for providing access to user registers 404 of a user design in a programmable logic device (PLD) 406 in accordance with various embodiments of the invention.

The system may be implemented as a general-purpose computer 402 that includes a processor 408 and a memory 410, which includes software modules 412, 414, and 416 of instructions for providing access to user registers 404 of a user design that is implemented in PLD 406. The instructions of software module 412 may cause processor 408 to compile configuration data from a hardware specification that includes a specification of the user design. The hardware specification may specify the user design and additional logic for providing access to certain user registers 404 of the user design. The instructions of software module 414 may cause processor 408 to transfer the configuration data to the PLD 406. The configuration data may configure the PLD 406 to implement the user design and the additional logic for providing access to the user registers 404 of the user design. Those skilled in the art will recognize that various alternative computing arrangements, for example, a network of computers, may be used in lieu of the general-purpose computer 402.

The instructions of software module 416 may cause processor 408 to emulate a terminal that is a user interface for accessing the user registers 404 of the user design. The terminal emulator may communicate data between the general-purpose computer 402 and a processor 418 in PLD 406. The communicated data may include access commands transferred from the general purpose computer 402 to the processor 418 via serial interface 420 and values of user registers 404 transferred from the processor 418 of PLD 406 to the general purpose computer 402.

Figure 5:
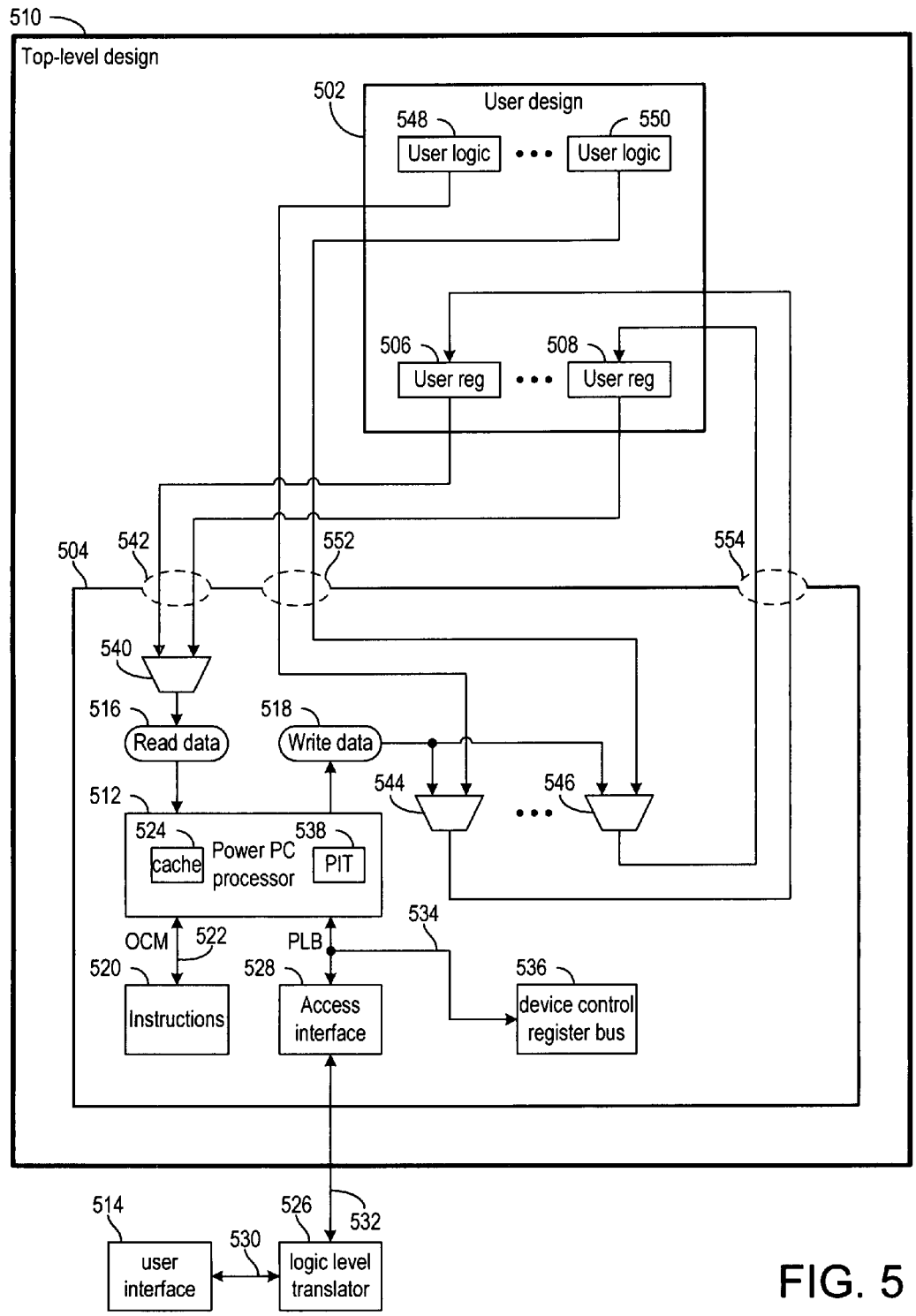
FIG. 5 is a block diagram illustrating a hardware specification of the user design and a module for accessing user registers of the user design in accordance with various embodiments of the invention.

FIG. 5 is a block diagram illustrating a hardware specification of the user design 502 and a module 504 for accessing user registers 506 and 508 of the user design 502 in accordance with various embodiments of the invention. The user design 502 and the module 504 may be combined to form a top-level design 510 that is compiled to generate configuration data that implements the top-level design 510 in a PLD. An implementation of the top-level design 510 in a PLD may communicate via logic level translator 526 with a user interface 514 for accessing the user registers 506 and 508.

Processor 512 may be a PowerPC processor that reads and writes the user registers 506 and 508 as directed by access commands provided at user interface 514. In one embodiment, user interface 514 may be a terminal or a terminal emulator executing on a general-purpose computer. A user may enter a read command at user interface 514 with the read command identifying at least one of the user registers 506 or 508. Processor 512 may respond to the read command by sending the data 516 read from the identified user register to the user interface 514. A user may also enter a write command at user interface 514 with the write command identifying one of the user registers 506 or 508 and providing write data. Processor 512 may respond to the write command by writing the write data 518 into the identified user register.

In one embodiment, processor 512 may execute instructions 520 fetched via an on-chip memory bus (OCM) on line 522. In another embodiment, processor 512 may execute instructions fetched from cache 524 of processor 512. In another embodiment, processor 512 may execute instructions fetched from a memory attached (not shown) on the processor local bus (PLB) 534. The instructions may direct processor 512 to accept an access command from user interface 514 via logic level translator 526 and access interface 528.

In one embodiment, logic level translator 526 translates between RS232 voltage levels on line 530 and an input/output drive level of a PLD on line 532. Access interface 528 may be an input pin for receiving serial data from user interface 514 and an output pin for transmitting serial data to user interface 514. A processor local bus on line 534 may couple the processor 512 to the access interface. Alternatively, access interface 528 may be one or more registers that processor 512 accesses via device control register bus 536.

The instructions 520 may cause processor 512 to poll the data received from user interface 514 via translator 526 and access interface 528. A programmable interval timer 538 may establish a polling rate by periodically interrupting processor 512. Each interrupt from programmable interrupt timer 538 may cause processor 512 to execute a load instruction in an interrupt service routine to load the next bit of an access command from user interface 514. Once a complete access command is received, processor 512 may read or write registers 506 and 508 as directed by the access command.

For a read command to read an identified one of registers 506 or 508, multiplexer 540 may select the read data 516 from the appropriate one of user registers 506 or 508. The read command may identify one of registers 506 or 508 with an address value, and multiplexer 540 may implement an address map for the user registers 506 and 508. The processor 512 may receive the read data 516 from the user registers 506 and 508 of the user design 502 via an input port 542 of module 504.

Multiplexer 544 and 546 may have a normal operating mode that allows user design 502 to control the updating of user registers 506 and 508. In the normal operating mode, user logic 548 may control the updating of user register 506 and user logic 550 may control the updating of user register 508. The data and optional write control signals from user logic 548 may be routed from user design 502 to multiplexer 544 via input port 552 of module 504. In the normal operating mode, multiplexer 544 may select these data and optional write control signals for return to user register 506 via output port 554. Multiplexer 546 may similarly select data and optional write control signals from user logic 550 for return to user register 508 in the normal operating mode.

For a write command to write data to an identified one of user registers 506 or 508, processor 512 may control the data and optional control signals of the identified user register 506 or 508 by switching the operating mode of the corresponding one or more of multiplexers 544 or 546. For an example of a write command to write data 518 to user register 506, processor 512 may switch the operating mode of multiplexer 544 to forward the write data 518 to user register 506, while leaving multiplexer 546 in the normal operating mode. Multiplexer 544 may be in the normal operating mode except during the execution of a write command to write data 518 to user register 506.

In some embodiments, complex access commands are permitted that can affect multiple registers simultaneously. For example, a fill command can be used to set each of a list of registers contained within a command to the same value. In such instances, processor 512 may operate multiplexer 544 and 546 simultaneously or sequentially, depending upon the programming of instructions 520, to effect the writing of data to one or more of user registers 506 and 508.

In one embodiment, module 504 supports up to 28 user registers 506 through 508 that each have up to 32 bits. Module 504 may be instantiated along with user design 502 to provide access to the user registers 506 through 508 when the user design 502 is implemented in a PLD. Up to 28 registers of the user design 502 may be selected to have access provided by module 504. Because the access to user registers 506 and 508 is provided by processor 512 and a small amount of programmable logic and interconnect resources of a PLD, access to user registers 506 and 508 may be provided while keeping most of the resources available for implementing the user design 502 in the PLD.

Figure 6:
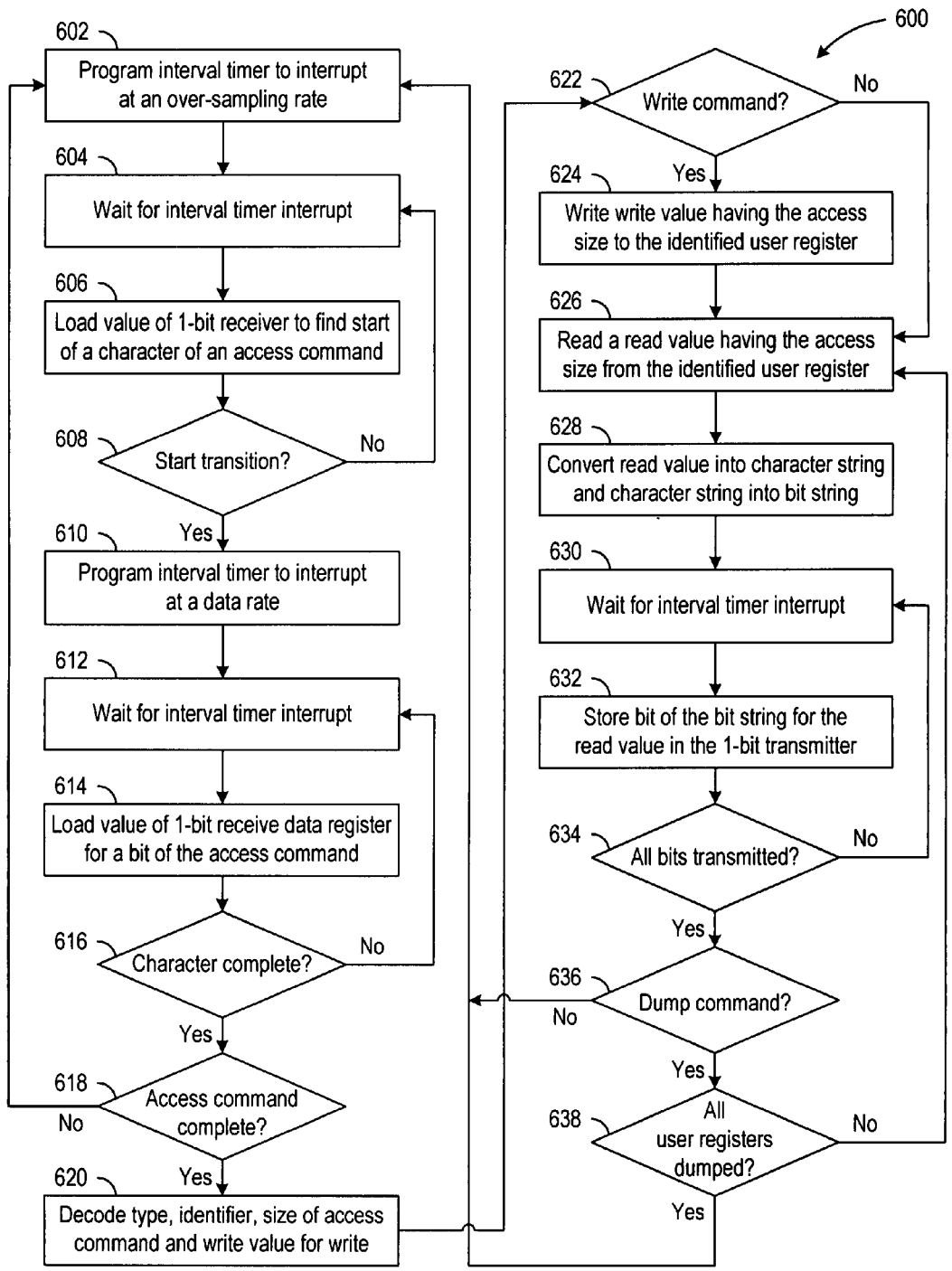
FIG. 6 is a flow diagram of a process for providing access to user registers in accordance with various embodiments of the invention.

FIG. 6 is an example flow diagram of a more detailed process 600 for providing access to user registers in accordance with serial interface-based embodiments of the invention. Individual user registers may be read or written and the contents of all of the user registers may be dumped.

First, the start of a character of an access command is determined. At step 602, an interval timer of a processor is set to generate a processor interrupt at an over-sampling rate. Process 600 waits for an interrupt from the interval timer at step 604. While waiting at step 604 and at other steps of process 600, the processor may be executing a wait loop or the processor may be performing certain tasks of a user design. At step 606, a value is loaded from a receiver for serially receiving access commands from a user interface. Decision 608 checks whether there is a start transition between the current value and the preceding values loaded at step 606. When there is no start transition or no preceding value loaded yet, process 600 returns to step 604; otherwise, process 600 proceeds to step 610.

After determining the timing of the beginning of a character of an access command within the granularity of the over-sampling rate, the next character of the access command is received. At step 610, the interval timer may be optionally programmed to interrupt the processor at a rate for serially receiving the bits of the characters of the access command. At step 612, process 600 waits for an interrupt and after the interrupt the value from the receiver is loaded at step 614. Decision 616 checks whether the value loaded at step 614 is the last bit of a character of an access command. If additional bits are expected for the character, process 600 returns to step 612; for a completed character, process 600 proceeds to decision 618.

Characters are received from the user interface until a complete access command is received. Decision 618 may check whether the current character is a special character, such as a carriage return character, signifying the end of an access command. If the access command is not yet complete, process 600 may return to step 602 to find the start of the next character of the access command. For a completed access command process 600 proceeds to step 620.

The access command is decoded at step 620, including determining the type of the access command and any parameters of the access command. The access command may have a type of a read command, a write command, or a dump command. A read or write command may have a parameter identifying the register to be accessed and another parameter specifying the size of the access. A write command may also have a parameter specifying the data to be written to the identified register and this data may be converted from a character string to binary data. An error message may be issued for an incorrectly formatted access command.

Decision 622 checks whether the access command is a write command. For a write command, process 600 proceeds to step 624. If the type of the access command is a read command or a dump command, process 600 proceeds to step 626. At step 624, the value specified in the write command is written to the identified register. For a read command, decision 622 also effectively checks for a read command by proceeding from decision 622 to step 626. At step 626, process 600 reads the specified size of the identified register regardless of the type of the access command. If the type of the access command is a write command, the value read at step 626 may be used to confirm that the write at step 624 was successful by displaying the value read at step 626 on the user interface.

The value read for the read, write, or dump command may be converted to a character string at step 628 and the character string may be converted to a bit string, for example, by the addition of start and stop bits for each character. Process 600 waits for the time interval of a bit time at step 630. After the interrupt from the programmable interval timer, the next bit of the bit string is sent to the transmitter at step 632. Decision 634 checks whether all the bits are transmitted. Process 600 returns to step 630 if there are more bits to transmit and otherwise process 600 proceeds to decision 636.

Decision 636 checks whether the access command is a dump command. If the access command is not a dump command, then the read or write command is completed and process 600 returns to step 602 to receive the next access command. If the access command is a dump command, then process 600 proceeds to decision 638 to check whether all registers are dumped. If more registers need to be dumped, then process 600 returns to step 626 with the identified register being the next register to be dumped. When all registers are dumped for a dump command, process 600 returns to step 602 to receive the next access command.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for analyzing PLD-based user designs. Further, while FPGAs are utilized as exemplary PLDs with which the invention can be practiced, other types of PLDs can also be used. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An integrated circuit (IC), comprising:
    an array of programmable resources and interconnect resources, wherein at least one memory of the IC is initialized with instructions, and a portion of the programmable resources and interconnect resources is configured to implement an access interface, multiplexer logic, and a user design including a plurality of user registers; and
    a processor coupled to the programmable resources and interconnect resources, the processor adapted to execute the instructions from the at least one memory, causing the processor to perform operations including:
        receiving an access command that includes an identifier of one of the user registers from an external user interface via the access interface;
        in response to the access command being a read command, reading a read value from the one of the user registers and transmitting the read value to the external user interface via the access interface; and
        in response to the access command being a write command, writing a write value that is included in the access command to the one of the user registers via the multiplexer logic, wherein the processor and the user design are both coupled to write to the user registers via the multiplexer logic;

wherein the portion of the programmable resources and interconnect resources of the array is configured to implement the access interface as a serial interface;

the receiving of the access command includes loading each of a plurality of bits of the access command from a 1-bit receiver of the serial interface; and the transmitting of the read value includes storing each of at least one bit of the read value in a 1-bit transmitter of the serial interface.

2. The IC of claim 1, wherein:

the receiving of the access command includes loading a plurality of bits of the access command from a receiver of the access interface; and the transmitting of the read value to the external interface includes storing a plurality of bits of the read value in a transmitter of the access interface.

3. The IC of claim 2, wherein the portion of the programmable resources and interconnect resources of the array is configured to implement the access interface as a parallel interface.

4. The IC of claim 1, wherein the IC is programmed with configuration data that initializes the at least one memory with the instructions and configures the portion of the programmable resources and interconnect resources to implement the serial interface, the multiplexer logic, and the user design, the configuration data being generated from an instantiation of the user design together with an instantiation of a module that includes the processor, the instructions, the serial interface, and the multiplexer logic.

5. The IC of claim 4, wherein the module has ports for coupling to outputs of the user registers, ports for coupling to inputs of the user registers, and ports for coupling to outputs of the user design for writing to the user registers.

6. The IC of claim 1, wherein the loading of the bits of the access command includes repeatedly loading a bit value from the 1-bit receiver of the serial interface from repeated execution of one or more of the instructions until a transition in the bit value indicates synchronization with a start of the access command.

7. The IC of claim 6, wherein:

the repeatedly loading of the received value from the 1-bit receiver of the serial interface is performed at an oversampling rate; and the loading of each of the bits of the access command from the 1-bit receiver of the serial interface is performed at a data rate.

8. The IC of claim 7, wherein the processor includes a programmable interval timer adapted to interrupt the processor at a rate selected from a group consisting of: the oversampling rate and the data rate.

9. The IC of claim 1, wherein:

the access command further includes an access size;

the operations performed by the processor include the reading of the read value having the access size from the one of the user registers and the transmitting of the read value having the access size to the external user interface via the 1-bit transmitter of the serial interface; and the operations performed by the processor further include the writing of the write value having the access size to the one of the user registers via the multiplexer logic.

10. The IC of claim 1, wherein the at least one memory of the IC is selected from a group consisting of: a cache of the processor and at least one block RAM of the programmable resources and interconnect resources.

11. A system for providing access to a plurality of user registers of a user design in an integrated circuit (IC), the system comprising:

a computing arrangement configured with a compiler, a programmer, and a terminal emulator;

wherein the compiler generates configuration data from a hardware specification that includes the user design and a module that specifies a processor, instructions for the processor, an access interface, and multiplexer logic;

wherein the programmer transfers the configuration data from the computing arrangement to the IC, the IC including the processor and an array of programmable resources and interconnect resources, wherein the transfer of the configuration data initializes at least one memory of the array with the instructions and implements the access interface, the multiplexer logic, and the user design including the user registers in a portion of the array; and wherein the terminal emulator communicates between the computing arrangement and the processor of the IC, the communicating including:

transferring an access command that includes an identifier of one of the user registers from the terminal emulator to the processor via the access interface, wherein the access command is transferred via a receiver of the access interface;

in response to the access command being a read command, reading a read value from the one of the user registers by the processor and transferring the read value from the processor to the terminal emulator via the access interface, wherein the read value is transferred via a transmitter of the access interface; and in response to the access command being a write command, writing a write value that is included in the access command to the one of the user registers by the processor via the multiplexer logic, wherein the processor and the user design are both coupled to write to the user registers via the multiplexer logic;

wherein the terminal emulator serially communicates between the computing arrangement and the processor;

the transferring of the access command is via a 1-bit receiver of the access interface by execution of one or more of the instructions by the processor; and the transferring of the read value to the terminal emulator is by each individual bit of the read value via a 1-bit transmitter of the access interface with execution of one or more of the instructions by the processor.

12. The system of claim 11, wherein the response to the access command being the write command includes reading a feedback value from the one of the user registers by the processor after the writing of the write value to the one of the user registers.

13. A method for providing access from a user interface to a plurality of user registers of a user design in an integrated circuit (IC), the method comprising:

programming the IC, wherein the IC includes a processor and an array of programmable resources and interconnect resources, with configuration data that initializes at least one memory of the array with instructions and implements an access interface, multiplexer logic, and the user design including the user registers in a portion of the array;

transferring an access command that includes an identifier of one of the user registers from the user interface to the processor via the access interface, wherein the access command is transferred via a receiver of the access interface and controlled by execution of at least one of the instructions by the processor;

in response to the access command being a read command, reading a read value from the one of the user registers by the processor and transferring the read value from the processor to the user interface via the access interface, wherein the read value is transferred via a transmitter of the access interface and controlled by execution of at least one of the instructions by the processor; and in response to the access command being a write command, writing a write value that is included in the access command to the one of the user registers by the processor via the multiplexer logic, wherein the processor and the user design are both coupled to write to the user registers via the multiplexer logic;

wherein the transferring of the access command includes transferring each of a plurality of bits of the access command via a 1-bit receiver of the access interface with execution of one or more of the instructions by the processor; and the reading of the read value from the one of the user registers includes transferring each bit of the read value to the user interface via a 1-bit transmitter of the access interface with execution of one or more of the instructions by the processor.

14. The method of claim 13, further comprising compiling the configuration data from a top-level design including the user design and a module that includes the processor, the instructions for the processor, the access interface, and the multiplexer logic, wherein the top-level design specifies that output ports of the user registers are coupled to input ports of the module, specifies that output ports of the user design for writing to the user registers are coupled to input ports of the module, and specifies that output ports of the module are coupled to input ports of the user registers.

15. The method of claim 13, wherein the transferring of the access command includes repeatedly transferring a bit value from the user interface to the processor via the 1-bit receiver of the access interface with execution of one or more of the instructions until a transition in the bit value indicates synchronization with a start of the access command.

16. The method of claim 13, further comprising, in response to the access command being a dump command, reading respective read values from all of the user registers by the processor and transferring the read values from the processor to the user interface via the access interface, wherein each of the read values is transferred via the access interface with execution of one or more of the instructions by the processor.

17. The method of claim 13, wherein the transferring of the access command includes translating between first logic levels of the access interface and second logic levels of the user interface and the transferring of the read value includes translating between the second logic levels of the user interface and the first logic levels of the access interface.

\* \* \* \* \*